United States Patent
Ohta et al.

(10) Patent No.: US 8,125,023 B2
(45) Date of Patent: Feb. 28, 2012

(54) VERTICAL TYPE POWER SEMICONDUCTOR DEVICE HAVING A SUPER JUNCTION STRUCTURE

(75) Inventors: Hiroshi Ohta, Hyogo-ken (JP); Wataru Saito, Kanagawa-ken (JP); Syotaro Ono, Kanagawa-ken (JP); Munehisa Yabuzaki, Kanagawa-ken (JP); Nana Hatano, Kanagawa-ken (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 12/620,045

(22) Filed: Nov. 17, 2009

(65) Prior Publication Data

US 2010/0123186 A1 May 20, 2010

(30) Foreign Application Priority Data

Nov. 20, 2008 (JP) .................................. 2008-296673

(51) Int. Cl.
*H01L 29/78* (2006.01)
(52) U.S. Cl. ........ 257/329; 257/341; 257/335; 257/288; 257/401; 257/901; 257/E29.257; 257/E21.19; 257/E21.21; 257/E21.394
(58) Field of Classification Search .................. 257/329, 257/341, E29.257, 335, 288, 401, E21.19, 257/E21.21, E21.394
See application file for complete search history.

(56) References Cited

U.S. PATENT DOCUMENTS

| | | | |
|---|---|---|---|
| 2002/0167020 A1* | 11/2002 | Iwamoto et al. | 257/110 |
| 2005/0045922 A1* | 3/2005 | Ahlers et al. | 257/242 |
| 2006/0220156 A1* | 10/2006 | Saito et al. | 257/409 |
| 2006/0231917 A1* | 10/2006 | Ono et al. | 257/500 |
| 2007/0181925 A1 | 8/2007 | Yoon et al. | |
| 2008/0135926 A1* | 6/2008 | Ono et al. | 257/328 |
| 2009/0101974 A1 | 4/2009 | Saito et al. | |

FOREIGN PATENT DOCUMENTS

| | | |
|---|---|---|
| JP | 2001-244461 | 9/2001 |
| JP | 2008-130775 | 6/2008 |

OTHER PUBLICATIONS

Office Action issued Jun. 24, 2011 in Chinese patent Application No. 200911000119.4 (with English translation).

* cited by examiner

*Primary Examiner* — Marc Armand
(74) *Attorney, Agent, or Firm* — Oblon, Spivak, McClelland, Maier & Neustadt, L.L.P.

(57) ABSTRACT

In a vertical power semiconductor device having the super junction structure both in a device section and a terminal section, an n-type impurity layer is formed on the outer peripheral surface in the super junction structure. This allows an electric field on the outer peripheral surface of the super junction structure region to be reduced. Accordingly, a reliable vertical power semiconductor device of a high withstand voltage can be provided.

20 Claims, 15 Drawing Sheets

VERTICAL TYPE POWER SEMICONDUCTOR DEVICE HAVING A SUPER JUNCTION STRUCTURE

CROSS REFERENCE TO RELATED APPLICATIONS

This application is based upon and claims the benefit of priority from the prior Japanese Patent Application No. 2008-296673 filed in Japan on Nov. 20, 2008; the entire contents of which are incorporated herein by reference.

BACKGROUND OF THE INVENTION

The present invention relates to a semiconductor device such as MOSFET and particularly to a semiconductor device having a super junction structure in a drift layer of a vertical MOSFET.

On-resistance of a conventional vertical power MOSFET greatly depends on the electric resistance of its conductive layer (drift layer). Dopant concentration of the drift layer determines the electric resistance of the drift layer. Accordingly, as the dopant concentration becomes higher, the electric resistance can be reduced. The dopant concentration, however, cannot exceed a limit, which depends on the withstand voltage of a pn junction formed between the base layer and the drift layer. Namely, there is a tradeoff between the device withstand voltage and the on-resistance and thus the device withstand voltage or the on-resistance has a limit determined by the device material.

As an example to solve the problem of the tradeoff, a MOSFET with a super junction (SJ) structure formed in the drift layer is known (refer to Japanese Patent Application Laid-Open No. 2001-294461). The SJ structure includes a plurality of n– pillar layers and p– pillar layers formed from a surface of the drift layer toward a depth direction of the device. The n– pillar layers and the p– pillar layers are alternately arranged along the surface of the substrate. In the SJ structure, a non-doped layer is artificially formed by equalizing the amount of charge (amount of impurities) contained in the p-pillar layers with that contained in the n– pillar layers, thus keeping a high withstand voltage in the MOFFET. Further, by equally raising the impurity concentration in the n– pillar layers and in the p-pillar layers, a current flows through the highly doped n– pillar layers, hence a low on-resistance beyond the material limit can be realized.

In the above mentioned MOSFET with the SJ structure formed in the drift layer, the SJ structure area is formed also in the device terminal section and the amount of impurities in the n– pillar layers and in the p– pillar layers should be equally controlled with high precision in order to keep the withstand voltage of the device. However, it is difficult to make the amount of impurities in the n-pillar layers and in the p– pillar layers equal to each other with high precision due to variations in manufacturing and the amount of impurities in the p-pillar layers may get higher than in the n– pillar layers. When actually forming a device, the amount of impurities in the p– pillar layers are made a little higher than that in the n– pillar layers in some cases, in order to assure avalanche capability, or in order to assure the safety operation when the drain-source voltage exceeds the withstand voltage due to an inductive voltage caused by a rapid change in drain-source current due to generation of surge voltage.

When the amount of impurities in the p– pillar layers is higher than that in the n– pillar layers, depletion layers formed near the interface between the n– pillar layers and the p– pillar layers expands from the interface portion to an external portion of the device. The expansion of the depletion layers makes isoelectric lines dense on an outer peripheral surface of the SJ structure area and increases electric field that is a differentiation of potential, thereby decreasing the withstand voltage of the device and deteriorating the device reliability.

SUMMARY

One of the objects of the present invention is to provide a power semiconductor device that can improve reliability while increasing a withstand voltage by decreasing the electric field on an outer peripheral surface of a super junction structure area.

According to one embodiment of the present invention, a semiconductor device has a first conductive type high concentration semiconductor substrate and a first conductive type region formed on the high concentration semiconductor substrate, and comprising a device section and a terminal section that is an outer peripheral portion of the device section, wherein the device section includes: a second conductive type first base region formed on a surface area of the first conductive type region, a first conductive type source region formed on a surface area of the first base region, a gate electrode formed on at least partial region of the first base region with an insulating layer, a source electrode formed on the source region in contact with the first base region, a second conductive type device pillar layer extending from the first base region to a depth direction of the first conductive type region, and a drain electrode formed on a rear surface of the first conductive type high concentration semiconductor substrate, and the terminal section includes: a plurality of second conductive type terminal pillar layers extending from the surface of the first conductive type region to the depth direction of the first conductive type region, and a first conductive type impurity layer formed in the ring shape on an outer peripheral surface of a region including the plurality of the terminal pillar layers and a region corresponding to the first conductive type region between the terminal pillar layers, and encompassing the device section.

According to another embodiment of the invention, a semiconductor device has a first conductive type high concentration semiconductor substrate and a first conductive type region formed on the high concentration semiconductor substrate, and comprising a device section and a terminal section that is an outer peripheral portion of the device section, wherein the device section includes: a second conductive type first base region formed on a surface area of the first conductive type region, a gate electrode formed in the first base region, penetrating the first base region to reach the first conductive type region, a first insulating layer formed between the gate electrode and the first base region, between the gate electrode and the first conductive type region, a second insulating layer formed on the gate electrode, a source electrode formed on the second insulating layer, the first base region, and the source region, a second conductive type device pillar layer extending from the first base region to a depth direction of the first conductive type region, and a drain electrode formed on a rear surface of the first conductive type high concentration semiconductor substrate, and the terminal section includes: a plurality of second conductive type terminal pillar layers extending from the surface of the first conductive type region to the depth direction of the first conductive type region, and a first conductive type impurity layer formed in the ring shape on an outer peripheral surface of a region including the plurality of the terminal pillar layers and a region corresponding to the first conductive type region between the terminal pillar layers, and encompassing the device section.

DETAILED DESCRIPTION

Hereinafter, a power semiconductor device according to an embodiment of the invention will be described in detail with reference to the drawings.

Figure 1:
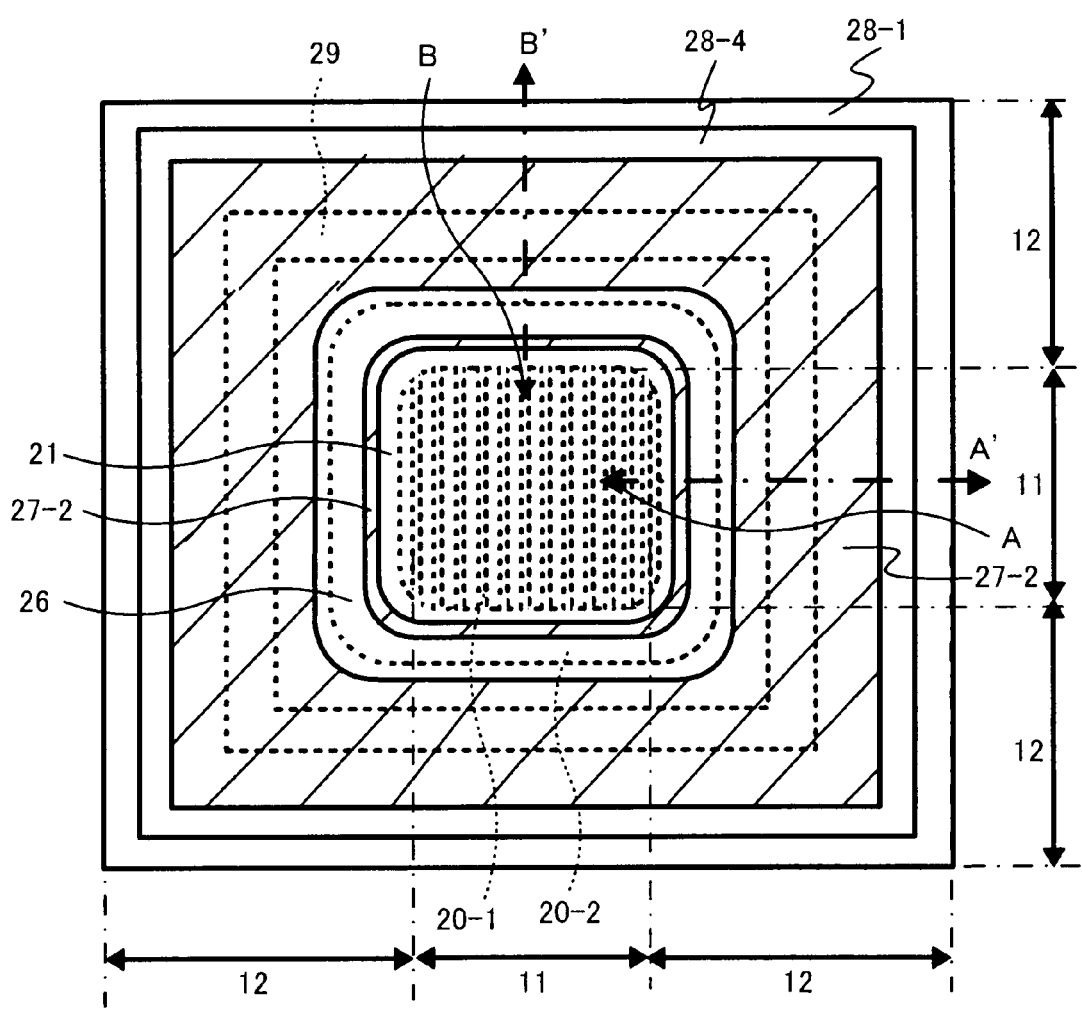
FIG. 1 is a top plan view illustrating a power semiconductor device according to one embodiment of the invention.
Figure 2:
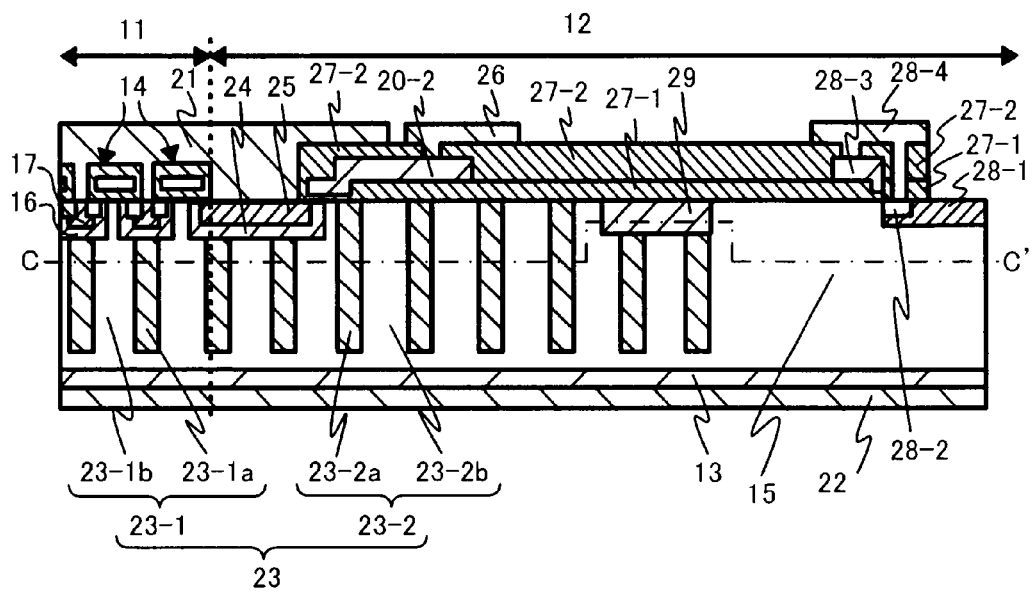
FIG. 2 is a cross-sectional view taken along a dashed and dotted line A-A" of FIG. 1.

FIG. 1 is a top plan view illustrating the power semiconductor device according to one embodiment of the invention. FIG. 2 is a cross-sectional view taken along the dashed and dotted line A-A' of FIG. 1 and FIG. 3 is a cross-sectional view taken along the dashed and dotted line B-B' of FIG. 1.

As illustrated in FIG. 1, a vertical power semiconductor device of the embodiment comprises a device section 11 and a terminal section 12 arranged around the outer peripheral portion of the device section 11.

Figure 3:
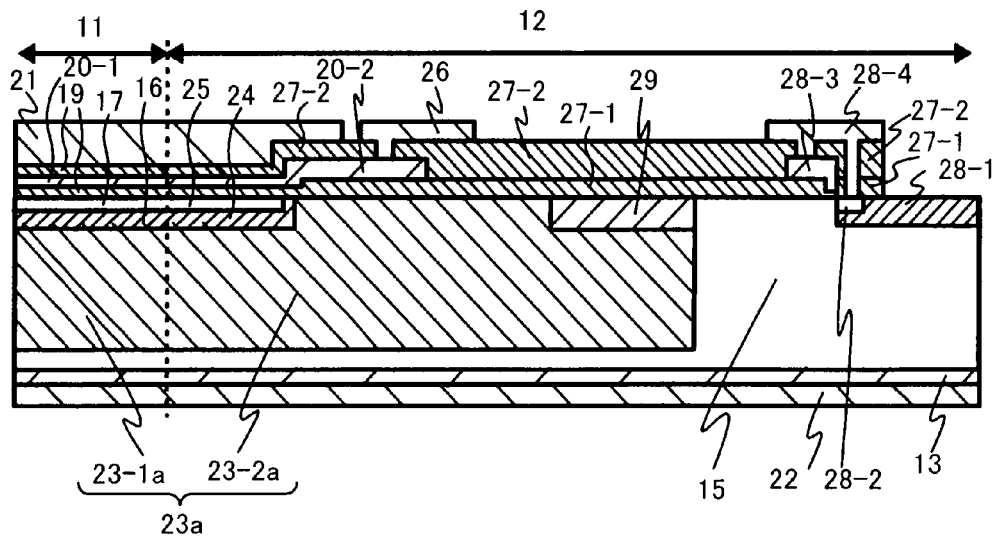
FIG. 3 is a cross-sectional view taken along a dashed and dotted line B-B' of FIG. 1.
Figure 9:
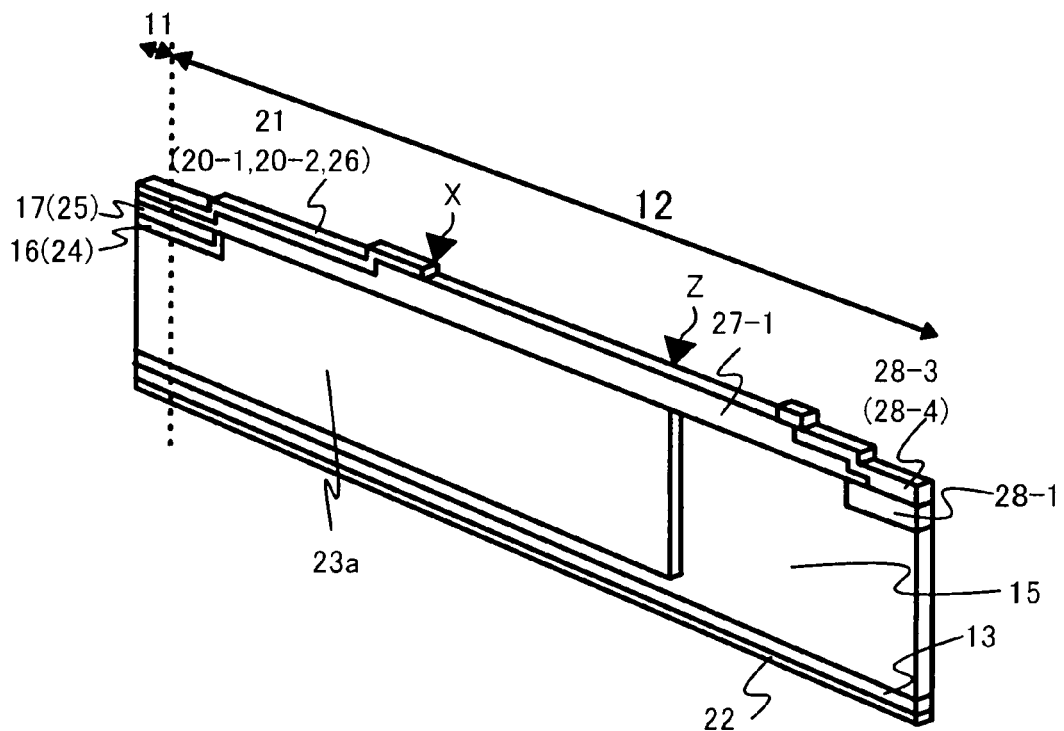
FIG. 9 is a perspective view illustrating the conventional power semiconductor device taken along the portion corresponding to that of FIG. 8 in order to simulate the electric field distribution and the potential distribution in the conventional power semiconductor device.

As illustrated in FIGS. 2 and 3, the device section 11 is a region where a plurality of planar gate vertical MOSFETs 14 are arranged on an n+ semiconductor substrate 13 of, for example, silicon. With reference to FIG. 9, the structure of the MOSFET will be hereinafter described.

Figure 4:
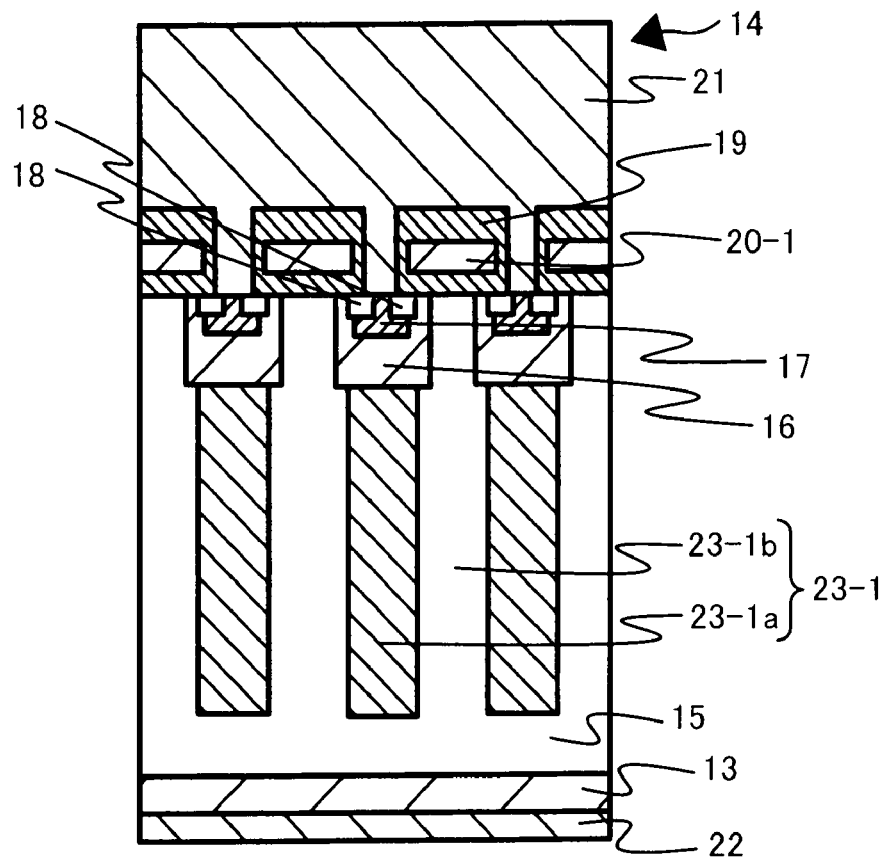
FIG. 4 is a partial cross-sectional view illustrating the structure corresponding to a device section of FIG. 2.

FIG. 4 is a partial cross-sectional view illustrating the structure of the planar gate vertical MOSFET 19 formed in the device section 11 in an enlarged way. As illustrated in FIG. 4, in the planar gate vertical MOSFET 14, the n-type region 15 is formed on an n+ semiconductor substrate 13. A plurality of first p-base layers 16 are formed at a distance from one another in a band shape on the surface of the n-type region 15. A plurality of first p+ contact layers 17 having higher concentration than the first p-base layers 16 are formed on the surface of each first p-base layer 16 in a band shape. A plurality of n+ source layers 18 are formed at a distance from one another on the surface of the first p-base layers 16 near the interface between the first p-base layers 16 and the first p+ contact layers 17.

A plurality of gate electrodes 20-1 formed of, for example, polysilicon are formed between adjacent first p-base layers 16 including partial regions of the adjacent first p-base layers 16, that is, a position between the adjacent first p+ contact layers 17. Each of the first gate electrodes 20-1 is covered with a first insulating layer 19 of, for example, SiO$_2$. A substantial square source electrode 21 is formed in the spaces between the first insulating layers 19 and on the first insulating layers 19 so that it may cover the device section 11 and a partial region of the terminal section 12, which will be described later. Further, a drain electrode 22 is formed on the whole rear surface of the n+ semiconductor substrate 13.

Figure 5:
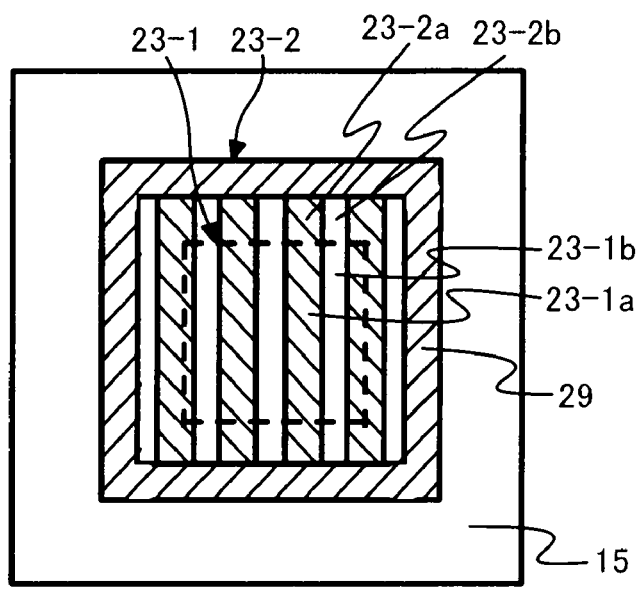
FIG. 5 is a horizontal cross-sectional view schematically illustrating a cross section taken along a dashed and dotted line C-C' of FIG. 2.

A device super junction structure region 23-1 (hereinafter, referred to as device SJ structure region 23-1) serving as a drift layer is formed in the n-type region 15 of the device section 11 as described above, as illustrated in FIGS. 2, 3, and 4. The device SJ structure region 23-1 includes a plurality of device p− pillar layers 23-1a and the n-type region 15 in the spaces between the device p-pillar layers 23-1a (hereinafter, this region is referred to as device n− pillar layer 23-1b). The device p− pillar layers 23-1a are respectively extended from the first p-base layers 16 to the depth direction of the device. FIG. 5 is a horizontal cross-sectional view schematically illustrating the cross section taken along the dashed and dotted line C-C' of FIG. 2. As illustrated in FIG. 5, the device pillar layers 23-1a and 23-1b are alternately arranged, for example, in a stripe shape.

On the other hand, as illustrated in FIGS. 2 and 3, the n-type region 15 is formed on the n+ semiconductor substrate 13 in the terminal section 12 integrally with the n-type region 15 of the device section 11. Further, a second p-base layer 29 is formed on the surface of the n-type region 15 of the terminal section 12 in a region in contact with the source electrode 21. A second p+ contact layer 25 having higher concentration than the second p-base layer 24 is formed on the surface of the second p-base layer 24. Although it is not illustrated, the second p-base layer 24 is connected to both ends of the first p-base layer 16 and formed in a ring shape so as to surround the above. Similarly, a second p+ contact layer 25 is connected to both ends of the first p+ contact layers 17 and formed in a ring shape so as to surround the above.

A second insulating layer 27-1 formed of, for example, SiO$_2$ is formed on a part of the surface of the n-type region 15 in the terminal section 12. Specifically, the second insulating layer 27-1 is formed in such a way that a region in contact with the source electrode 21 and a partial region on a third p-base layer 28-1, which will be described later, on the n-type region 15 of the terminal section 12 are opened. The second insulating layer 27-1 is integrally formed with the above-mentioned first insulating layer 19 between the first gate electrode 20-1 and the n-type region 15.

A second gate electrode 20-2 formed of polysilicon is formed on the second insulating film 27-1. The second gate electrode 20-2 is integrally formed with the above-mentioned first gate electrodes 20-1, and connected to both ends of the first gate electrodes 20-1 and formed in a ring shape so as to surround the above as illustrated by dotted lines in FIG. 1.

A third insulating layer 27-2 formed of, for example, SiO$_2$ is formed on the second gate electrode 20-2 and on the second insulating layer 27-1. Specifically, the third insulating layer 27-2 is formed in such a way that a partial region on the second gate electrode 20-2 is opened. The third insulating layer 27-2 is integrally formed with the above-mentioned first insulating layer 19 in contact with the upper portion and the side portion of the first gate electrodes 20-1.

A gate field plate electrode 26 is formed on the third insulating layer 27-2 including the opening portion. The gate field plate electrode 26 is formed in contact with the second gate electrode 20-2 at the opening portion.

The source electrode 21 formed on the above-mentioned device section 11 is in contact with the second p+ contact layer 25 and formed to cover a portion of the second gate electrode 20-2 with the third insulating layer 27-2 therebetween.

A third p-base layer 28-1 is formed on the outer peripheral surface of the n-type region 15 in the terminal section 12. An n+ layer 28-2 is formed on the surface of the third p-base layer 28-1 near the interface between the third p-base layer 28-1 and the n-type region 15.

Further, an EQPR (Equivalent Potential Ring) electrode 28-3 formed of polysilicon is formed on the surface of the n-type region 15 inside the third p-base layer 28-1 with the second insulating layer 27-1 therebetween. An EQPR taking out electrode 28-4 is formed on the EQPR electrode 28-3 with the third insulating film 27-2 therebetween. A partial EQPR taking out electrode 28-4 is formed in contact with the upper surface of the EQPR electrode 28-3 at the opening region formed the third insulating film 27-2. The another partial EQPR taking out electrode 28-4 is formed in contact with n-type impurity layer 29, which will be described later, at the opening region formed the second and the third insulating film 27-1,27-2. The potential of the EQPR electrode 28-3 becomes substantially the same as that of the drain electrode 22 when a voltage is applied to the drain electrode 22.

This outer peripheral structure of the n-type region 15 can restrain a depletion layer from expanding externally out of the device, which layer occurs in the abnormal condition, for example, that the movable ions of Na mix into the second and third insulating layers 27-1 and 27-2. Therefore, leakage current from the dicing surface can be restrained.

The terminal super junction structure region 23-2 (hereinafter, referred to as the terminal SJ structure region 23-2) serving as the drift layer is formed also in the n-type region 15 of the terminal section 12 as described above, as illustrated in FIGS. 2 and 3. The terminal SJ structure region 23-2 includes a plurality of terminal p− pillar layers 23-2a and the n-type region 15 (hereinafter, referred to as a terminal n− pillar layer 23-2b) in each space between the terminal p− pillar layers 23-2a. Of the above, the terminal p− pillar layers 23-2a are extended from the surface of the n-type region 15 of the terminal section 12 to the depth direction of the device. The terminal SJ structure region 23-2 is formed from the interface with the device section 11 externally out of the device to the almost middle portion of the terminal section 12.

The terminal SJ structure region 23-2 is integrally formed with the device SJ structure region 23-1 and the device SJ structure region 23-1 and the terminal SJ structure region 23-2 constitute the SJ structure region 23.

Further, an n-type impurity layer 29 is formed on the outer peripheral surface of the SJ structure region 23, as illustrated in FIGS. 2 and 3. As illustrated in FIG. 5, the n-type impurity layer 29 is formed in a ring shape on the outer peripheral surface of the SJ structure region 23, and encompassing the SJ structure region 23-1. The n-type impurity layer 29 is formed with the impurity concentration enough to make itself fully depleted (for example, the same concentration as the pillar layer), unlike the n-layer used for a conventionally known field stop layer.

In the power semiconductor device of the embodiment as described above, a method of forming the SJ structure region 23 includes, for example, the following method. Namely, the n-type region 15 is first epitaxially grown on the n+ semiconductor substrate 13. Next, a resist layer having a stripe-shaped opening is formed on the n-type region 15 and using this resist layer as a mask, boron (B), for example, is implanted in the n-type region 15. Through repetition of the epitaxial growth and the boron (B) implantation, the device p– pillar layer 23-1a and the terminal p– pillar layer 23-2a are formed. Thus, the device p– pillar layer 23-1a, the terminal p– pillar layer 23-2a, the device n– pillar layer 23-1b, and the terminal n– pillar layer 23-2b can be formed. After forming the above-mentioned SJ structure region 23, the n-type impurity layer 29 can be formed by forming a resist layer having an opening for exposing the outer peripheral surface of the SJ structure region 23 on the n-type region 15 having the SJ structure region 23 and by implanting phosphorus (P), for example, in the outer peripheral portion of the SJ structure region 23 using this resist layer as a mask.

Figure 6:
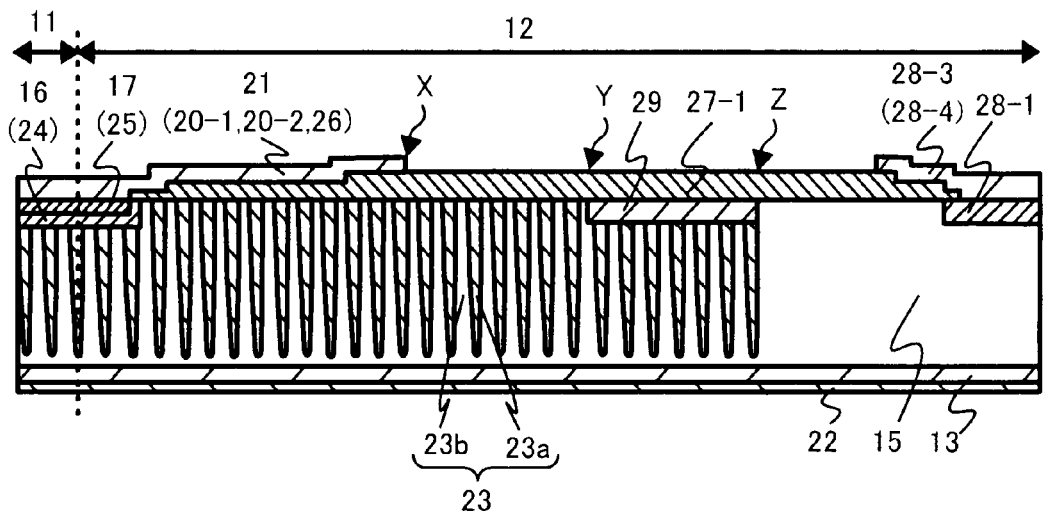
FIG. 6 is a cross-sectional view corresponding to the view of FIG. 2 partially modified in order to simulate an electric field distribution and a potential distribution in the power semiconductor device in FIG. 1.
Figure 7:
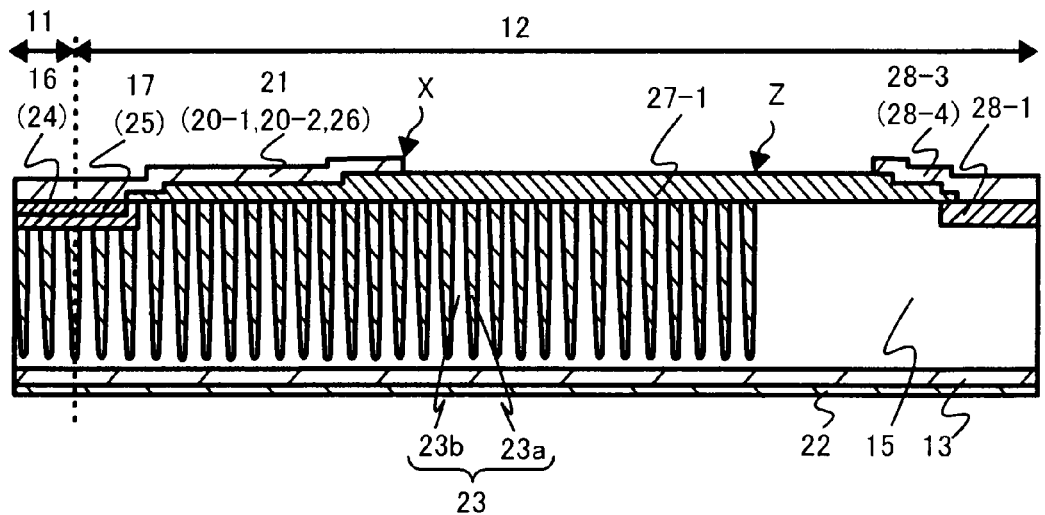
FIG. 7 is a cross-sectional view illustrating the conventional power semiconductor device taken along the portion corresponding to that of FIG. 6 in order to simulate the electric field distribution and the potential distribution in the conventional power semiconductor device.

Here, the following simulation was performed in order to examine an electric field distribution, a potential distribution, and a withstand voltage formed in the power semiconductor device according to the embodiment. FIG. 6 is a cross-sectional view corresponding to the view of FIG. 2 partially modified in order to simulate an electric field distribution in the cross section of the power semiconductor device illustrated in FIG. 2. FIG. 7 is a cross-sectional view illustrating the conventional power semiconductor device taken along the portion corresponding to FIG. 6 from which the n-type impurity layer 29 is removed in order to simulate an electric field distribution in cross section of the conventional power semiconductor device.

Figure 8:
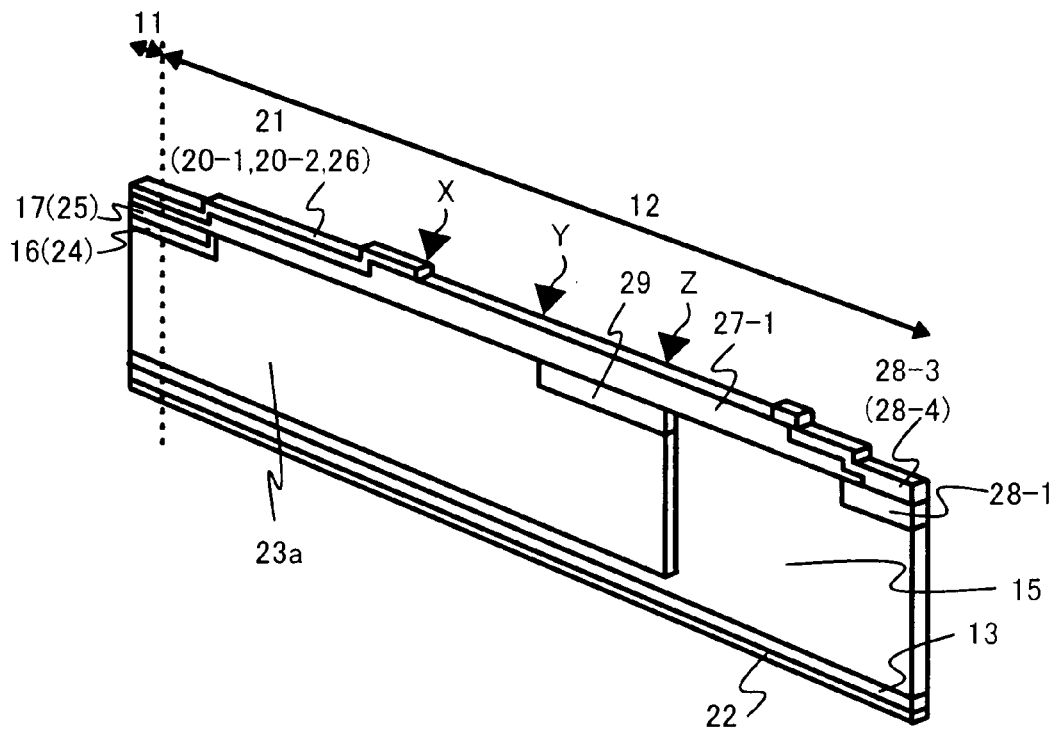
FIG. 8 is a perspective view corresponding to the view of FIG. 3 partially modified in order to simulate the electric field distribution and the potential distribution in the power semiconductor device of FIG. 1.

FIG. 8 is a perspective view corresponding to the view of FIG. 3 partially modified in order to simulate an electric field distribution in the cross section of the power semiconductor device of the embodiment illustrated in FIG. 3. FIG. 9 is a cross-sectional view illustrating the conventional semiconductor device taken along the portion corresponding to FIG. 8 from which the n-type impurity layer 29 is removed in order to simulate an electric field distribution in cross section of the conventional power semiconductor device.

In the following description of the cross-sectional views illustrated in FIGS. 6 to 9, the same numerals are assigned to the same components as in FIGS. 2 and 3, and their description is not repeated; here, the structure different from that of FIGS. 2 and 3 will be described briefly.

The p-base layer 16 (24) illustrated in FIGS. 6 to 9 corresponds to the first p-base layers 16 and the second p-base layer 24 illustrated in FIGS. 2 and 3 connected to each other. Further, the p+ contact layer 17 (25) illustrated in FIGS. 6 to 9 corresponds to the first p+ contact layers 17 and the second p+ contact layer 25 illustrated in FIGS. 2 and 3 connected to each other. These structures are simplified because they do not contribute to the withstand voltage in the terminal section.

The gate & source electrode 21 (20-1, 20-2, 26) illustrated in FIGS. 6 to 9 corresponds the first and second gate electrodes 20-1 and 20-2, the gate field plate electrode 26, and the source electrode 21 illustrated in FIGS. 2 and 3 integrated together. This structure is simplified because the simulation is performed with each potential of the electrodes 20-1, 20-2, 21, and 26 at the same level (ground level). For the same reason, the EQPR electrode 28-2 (28-4) illustrated in FIGS. 6 to 9 corresponds to the EQPR electrode 28-3 and the EQPR taking out electrode 28-4 illustrated in FIGS. 2 and 3 integrated together.

Further, the X point illustrated in FIGS. 6 to 9 indicates the end portion of the gate & source electrode 21 (20-1, 20-2, 26); the Y point indicates the end portion of the n-type impurity layer 29 at the side of the device section; and the Z point indicates the end portion of the outer peripheral portion 11 in the SJ structure region 23.

The power semiconductor devices having the structures as illustrated in FIGS. 6 to 9 are used for the simulation. The results will be described using FIGS. 10 to 23.

Figure 10:
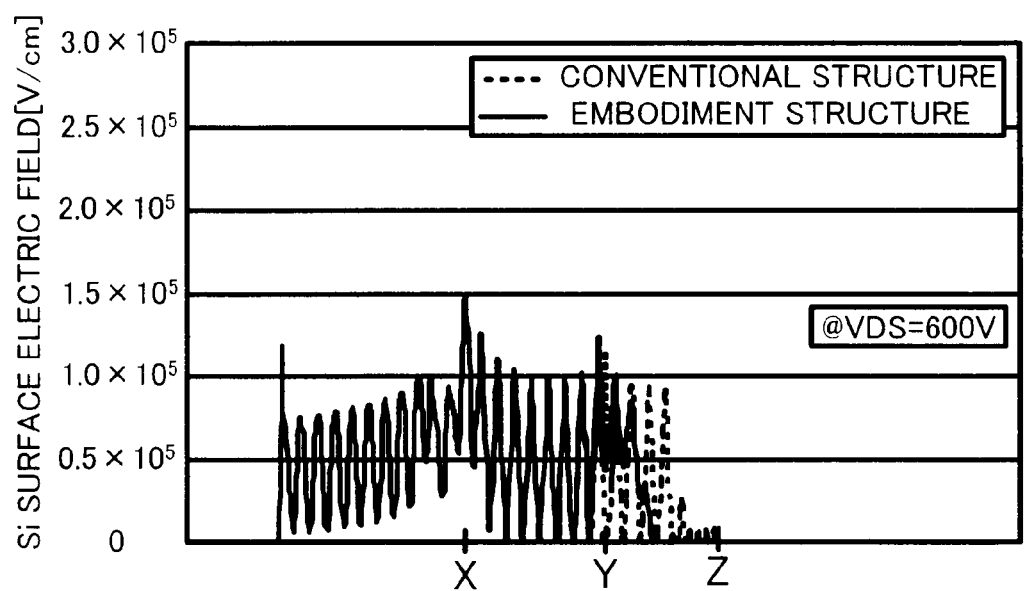
FIG. 10 is a graph showing the results of simulating the electric field distribution near the surfaces of the n-type regions in the device cross sections illustrated in FIGS. 6 and 7.

FIG. 10 is a graph showing the simulation results of the electric field distribution near the surfaces of the n-type regions 15 in the device cross sections illustrated in FIGS. 6 and 7 when the impurity concentration in the p– pillar layers 23a are equal to that in the n– pillar layers 23b (balanced condition). In the graph of FIG. 10, the horizontal axis indicates a position to the horizontal direction along the device cross section, while the vertical axis indicates the intensity of the electric field. The vertical axis and the horizontal axis illustrated in each of the graphs of subsequent FIGS. 11 to 13 indicate the same.

As shown in FIG. 10, the electric field distribution has a plurality of peaks corresponding to the arrangement of p– pillar layers 23a. However, the electric field intensity between the Y point and the Z point is decreased in the electric field distribution (solid line in FIG. 10) formed on the device cross section illustrated in FIG. 6 more than that in the electric field distribution (dotted line in FIG. 10) formed on the device cross section illustrated in FIG. 7.

Figure 11:
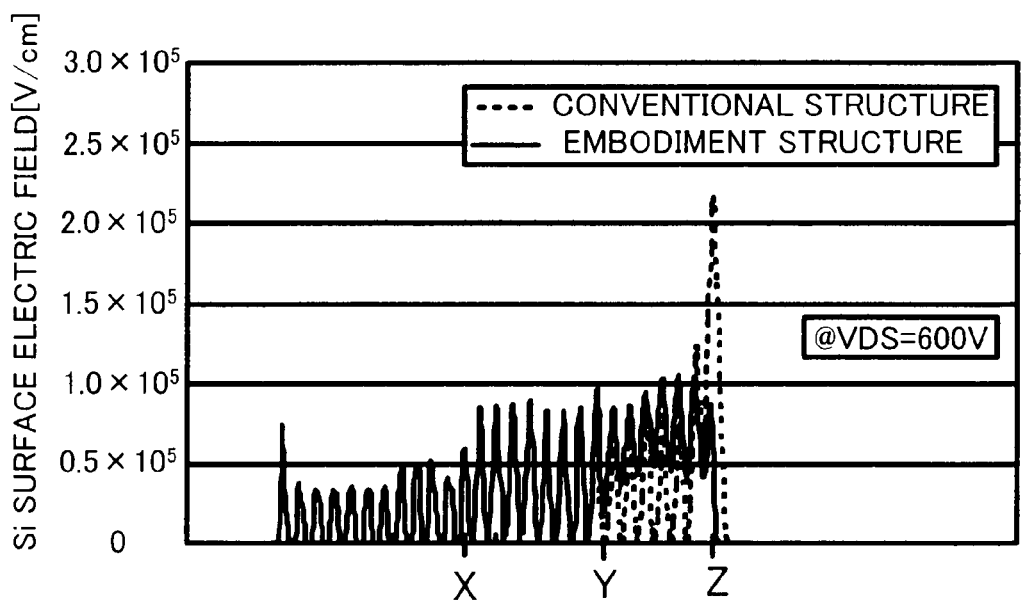
FIG. 11 is a graph showing the results of simulating the electric field distribution near the surfaces of the n-type regions in the device cross sections illustrated in FIGS. 6 and 7, with the condition changed.

FIG. 11 is a graph showing the simulation results of the electric field distribution near the surfaces of the n-type regions 15 in the device cross sections illustrated in FIGS. 6 and 7 when the impurity concentration in the p– pillar layers 23a are higher than that in the n– pillar layers 23b (p rich condition). As shown in FIG. 11, even under the p-rich condition, the electric field intensity between the Y point- and the Z point is decreased in the electric field distribution (solid line in FIG. 11) formed on the device cross section illustrated in FIG. 6 more than that in the electric field distribution (dotted line in FIG. 11) formed on the device cross section illustrated in FIG. 7, and it is greatly decreased especially near the Z point.

Figure 12:
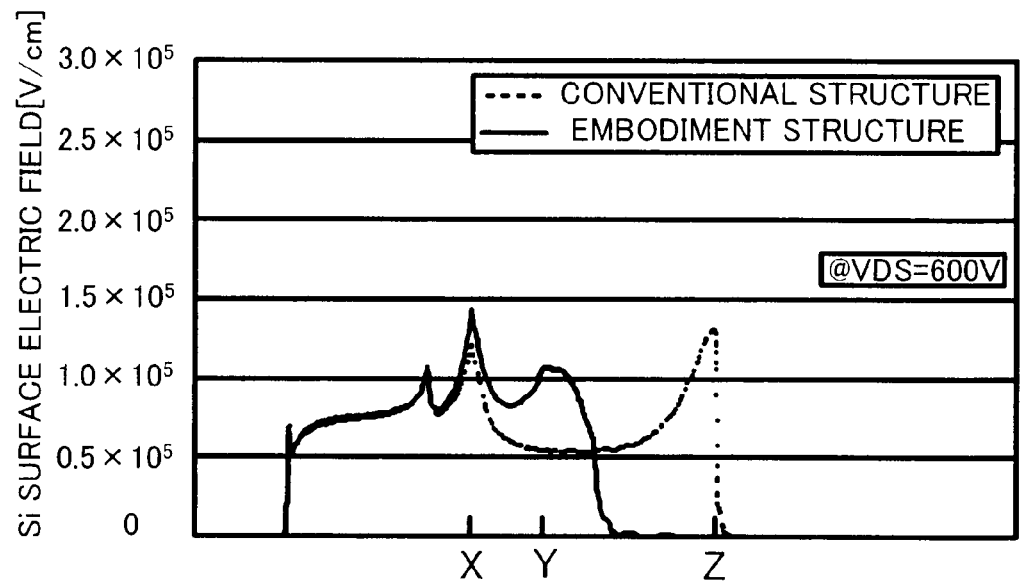
FIG. 12 is a graph showing the results of simulating the electric field near the surfaces of the n-type regions in the device cross sections illustrated in FIGS. 8 and 9.

FIG. 12 is a graph showing the simulation results of the electric field distribution near the surfaces of the n-type regions 15 in the device cross sections illustrated in FIGS. 8 and 9 under the balanced condition. As shown in FIG. 12, the electric field distributions are more uniform than those in FIGS. 10 and 11. The electric field intensity between the Y point- and the Z point is decreased in the electric field distribution (solid line in FIG. 12) formed on the device cross section illustrated in FIG. 8 more than that in the electric field distribution (dotted line in FIG. 12) formed on the device cross section illustrated in FIG. 9.

The electric field distributions shown in FIG. 12 have almost no peaks that are shown in FIGS. 10 and 11. This is because the device cross sections illustrated in FIGS. 8 and 9 are cross sections along one p– pillar layer 23a. Therefore, it is supposed that when the cross sections are shifted to be along one n– pillar layer 23b, substantially uniformed electric field distributions be formed with the intensity smaller than those of the electric field shown in FIG. 12.

Figure 13:
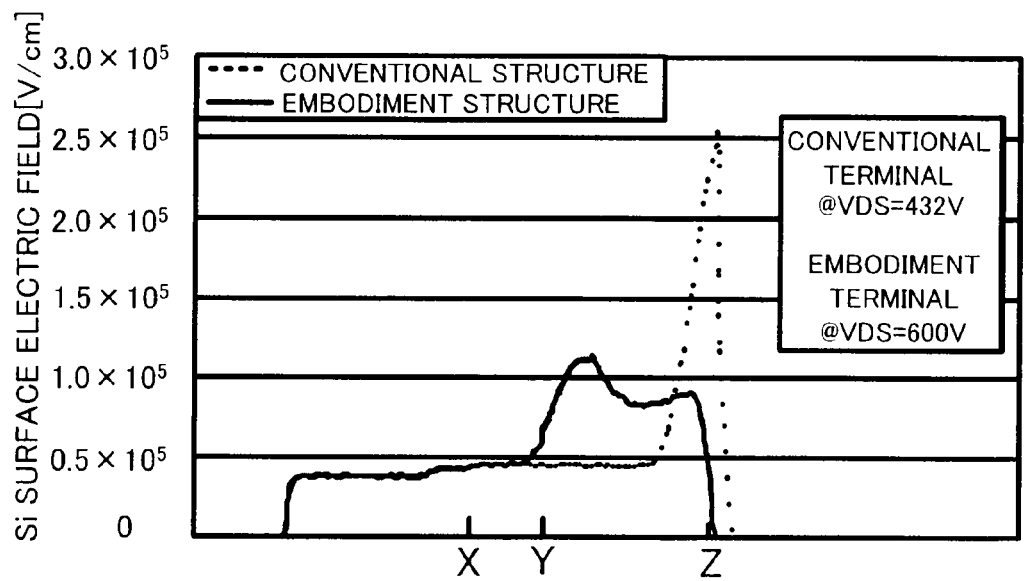
FIG. 13 is a graph showing the results of simulating the electric field near the surfaces of the n-type regions in the device cross sections illustrated in FIGS. 8 and 9, with the condition changed.

FIG. 13 is a graph showing the simulation results of the electric field distribution near the surfaces of the n-type regions 15 in the device cross sections illustrated in FIGS. 8 and 9 under the p-rich condition. As shown in FIG. 13, even under the p-rich condition, the electric field intensity between the Y point and the Z point is decreased in the electric field distribution (solid line in FIG. 13) formed on the device cross section illustrated in FIG. 8 more than that in the electric field distribution (dotted line in FIG. 13) formed on the device cross section illustrated in FIG. 9, and it is greatly decreased especially near the Z point.

According to FIGS. 10 to 13, it is found that the electric field intensity in the n-type impurity region 29 (Y-Z points)

can be decreased by forming the n-type impurity region 29 on the outer peripheral surface of the SJ structure region 23. Further, it is found that the electric field intensity in the outside end portion (near the Z point) of the n-type impurity region 29 can be greatly decreased, in the device cross section illustrated in FIG. 8 under the p-rich condition.

The reason for these results is that the p-pillar layer 23a on the outer peripheral surface of the SJ structure region 23 can be forcedly made into an n-rich state (where the impurity concentration in the n– pillar layers 23b is higher than that in the p– pillar layers 23a) by forming the n-type impurity layer 29 on the outer peripheral surface of the SJ structure region 23.

Figure 14:
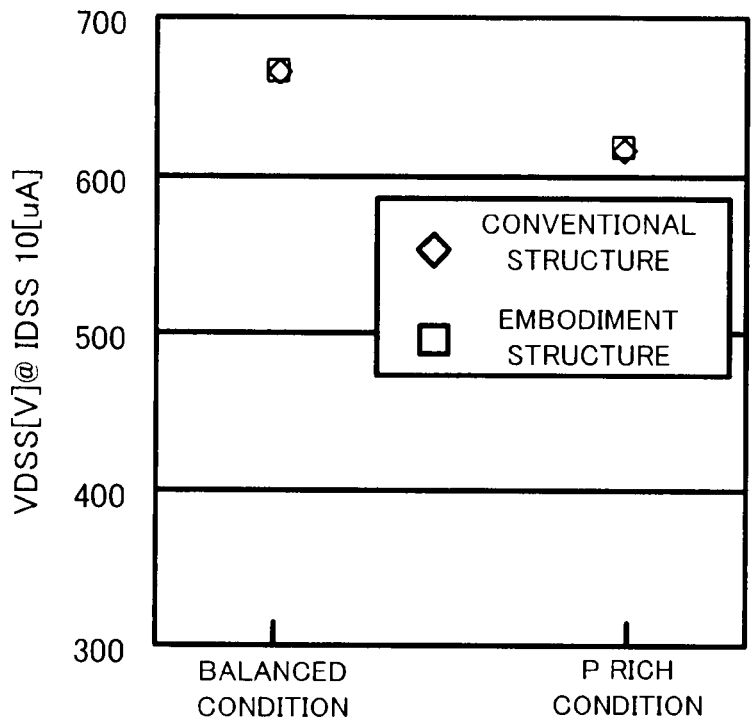
FIG. 14 is a graph showing the results of simulating the withstand voltage in the device cross sections illustrated in FIGS. 6 and 7.
Figure 15:
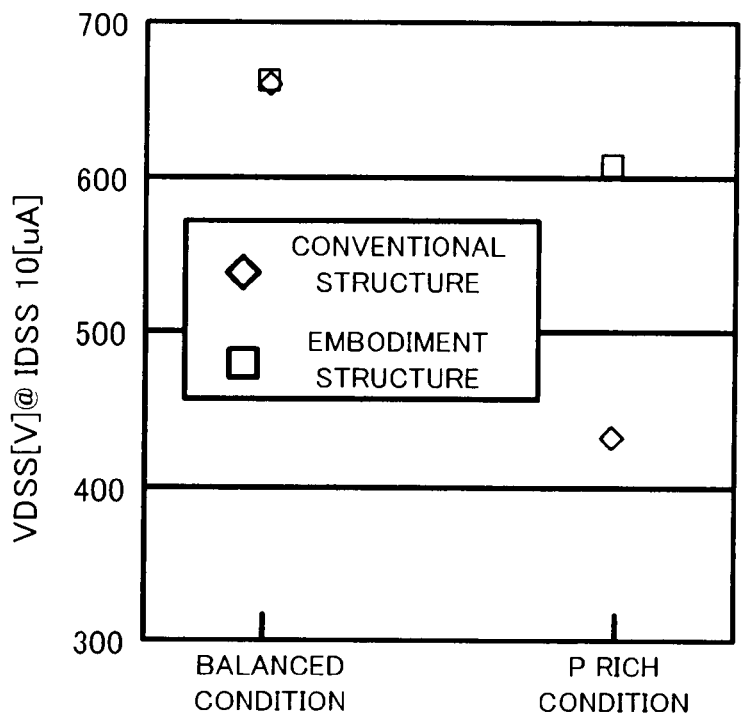
FIG. 15 is a graph showing the results of simulating the withstand voltage in the device cross sections illustrated in FIGS. 8 and 9.

As described above, by forming the n-type impurity region 29 on the outer peripheral surface of the SJ structure region 23, the electric field can be decreased on the region 29. Accordingly, a withstand voltage can be raised. FIG. 14 is a graph showing the simulation results of the withstand voltage in the device cross sections illustrated in FIGS. 6 and 7. FIG. 15 is a graph showing the results of simulating the withstand voltage in the device cross sections illustrated in FIGS. 8 and 9.

As shown in FIG. 14, the withstand voltage rises a little in the device cross sections illustrated in FIGS. 6 and 7, regardless of the condition. As shown in FIG. 15, the withstand voltage rises a little in the device cross sections illustrated in FIGS. 8 and 9 under the balanced condition. Under the p-rich condition, however, the withstand voltage greatly rises by about 200 V. These results agree with the simulation results of the electric field distribution shown in FIGS. 10 to 13.

Figure 16:
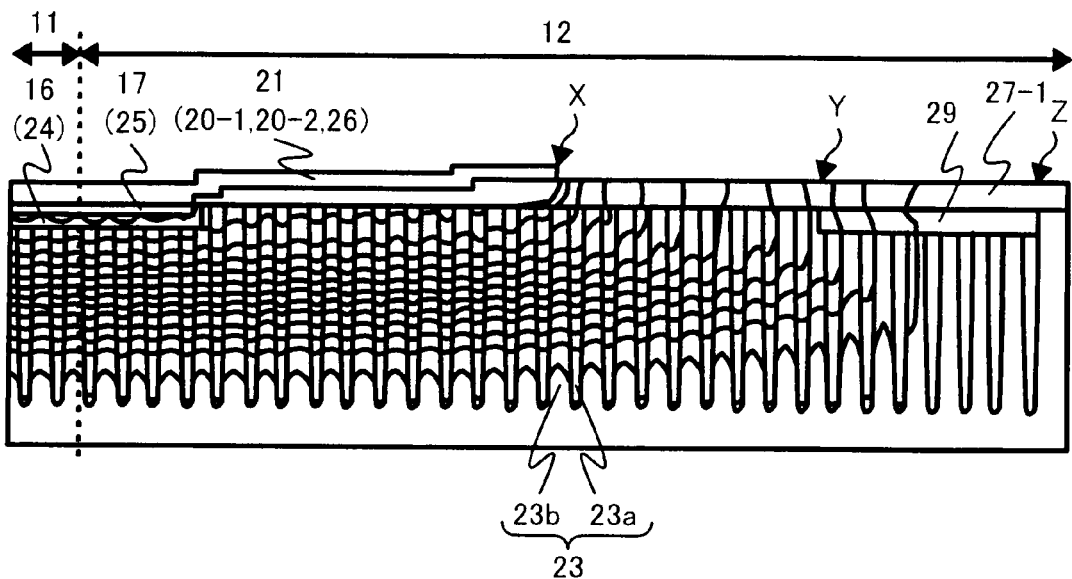
FIG. 16 is a graph showing the result of simulating the potential distribution in the device cross section illustrated in FIG. 6.
Figure 17:
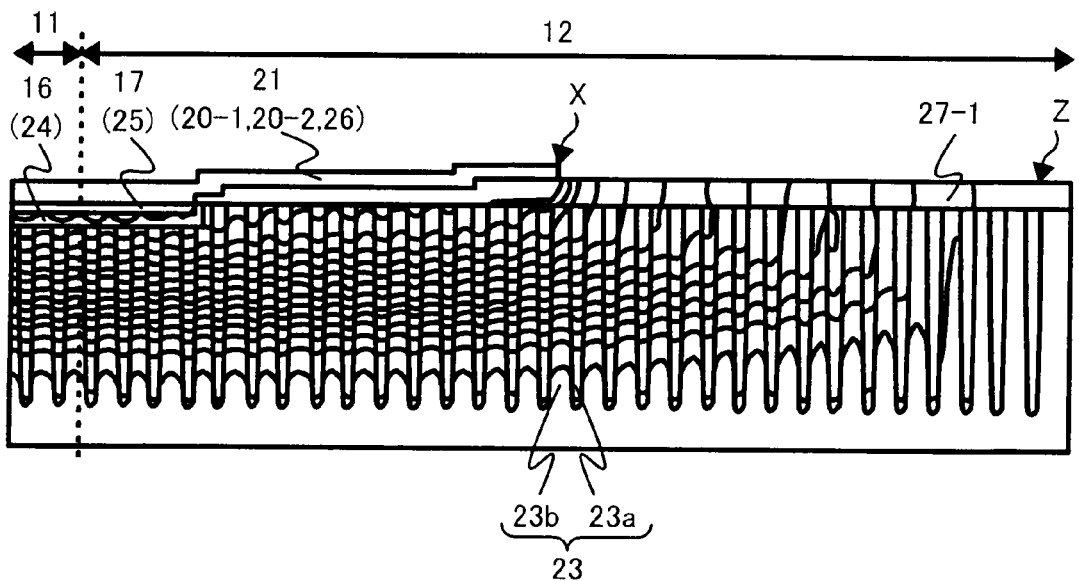
FIG. 17 is a graph showing the result of simulating the potential distribution in the device cross section illustrated in FIG. 7.

The simulation results of the electric field distribution shown in FIGS. 10 to 13 also agree with the simulation results of the potential distribution shown in FIGS. 16 to 23. FIG. 16 is a graph showing the simulation result indicating the potential distribution in the cross section illustrated in FIG. 6 under the balanced condition. FIG. 17 is a graph showing the simulation result indicating the potential distribution in the cross section illustrated in FIG. 7 under the balanced condition. In the graphs of FIGS. 16 and 17, the respective curves show the isoelectric lines. The curves illustrated in each of the subsequent graphs of FIGS. 18 to 23 show the same.

It is found that the distribution of the isoelectric lines shown in FIG. 16 is sparser on the outer peripheral surface of the SJ structure region 23 than that in the distribution of the isoelectric lines shown in FIG. 17. This agrees with the results shown in FIG. 10. The reason why the distribution of the isoelectric lines can be made sparse is as follows: by providing the n-type impurity region 29, the p– pillar layers 23a can be forcedly made in the n-rich state, thereby the depletion layer can be restrained from expanding externally. As a result, the distribution of the isoelectric lines on the surface of the n-type impurity region 29 can be made sparser.

Figure 18:
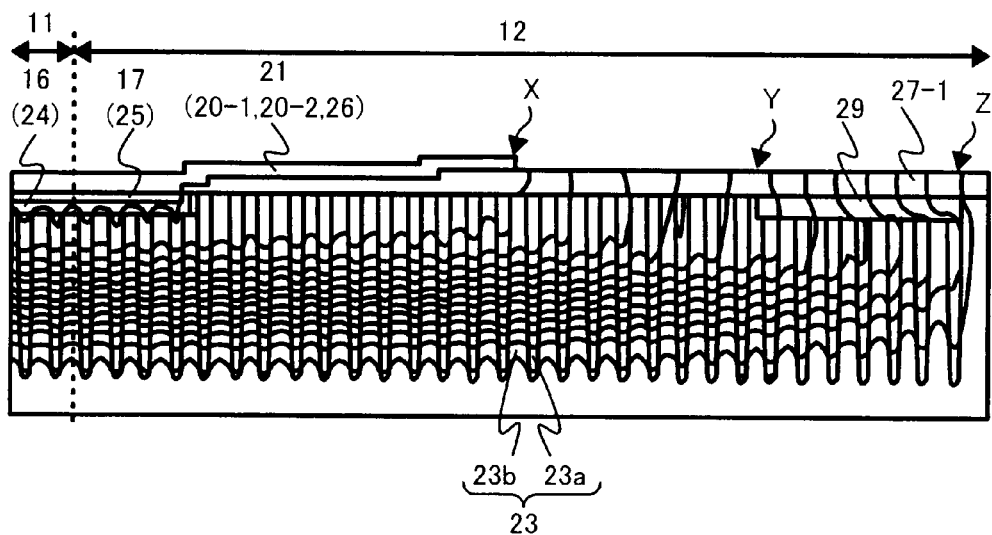
FIG. 18 is a graph showing the result of simulating the potential distribution in the device cross section illustrated in FIG. 6, with the device condition changed.
Figure 19:
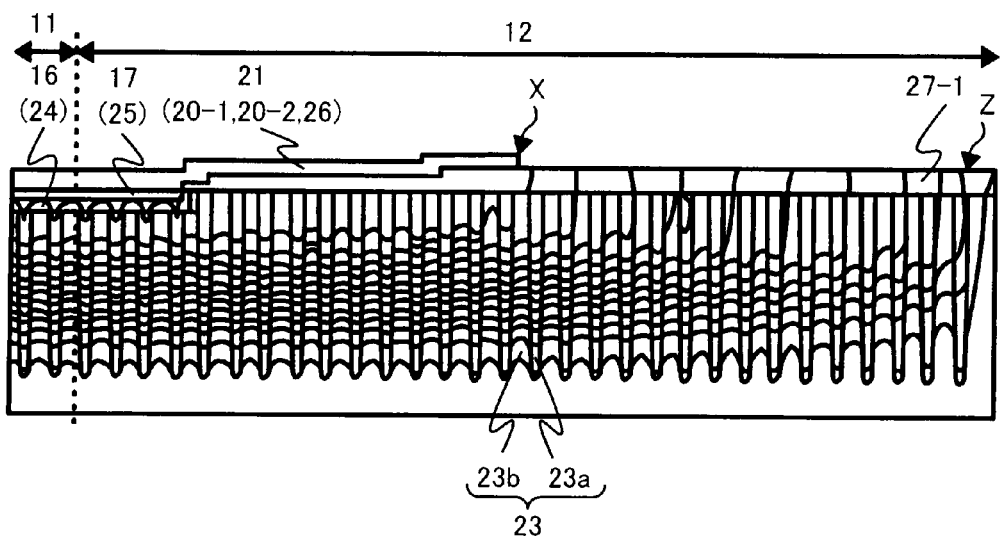
FIG. 19 is a graph showing the result of simulating the potential distribution in the device cross section illustrated in FIG. 7, with the device condition changed.

FIG. 18 is a graph showing the simulation result indicating the potential distribution in the cross section illustrated in FIG. 6 under the p-rich condition. FIG. 19 is a graph showing the simulation result indicating the potential distribution in the cross section illustrated in FIG. 7 under the p-rich condition. It is found that the distribution of the isoelectric lines shown in FIG. 18 is sparser on the outer peripheral surface in the SJ structure region 23 than that in the distribution of the isoelectric lines shown in FIG. 19. This agrees with the results shown in FIG. 11.

Figure 20:
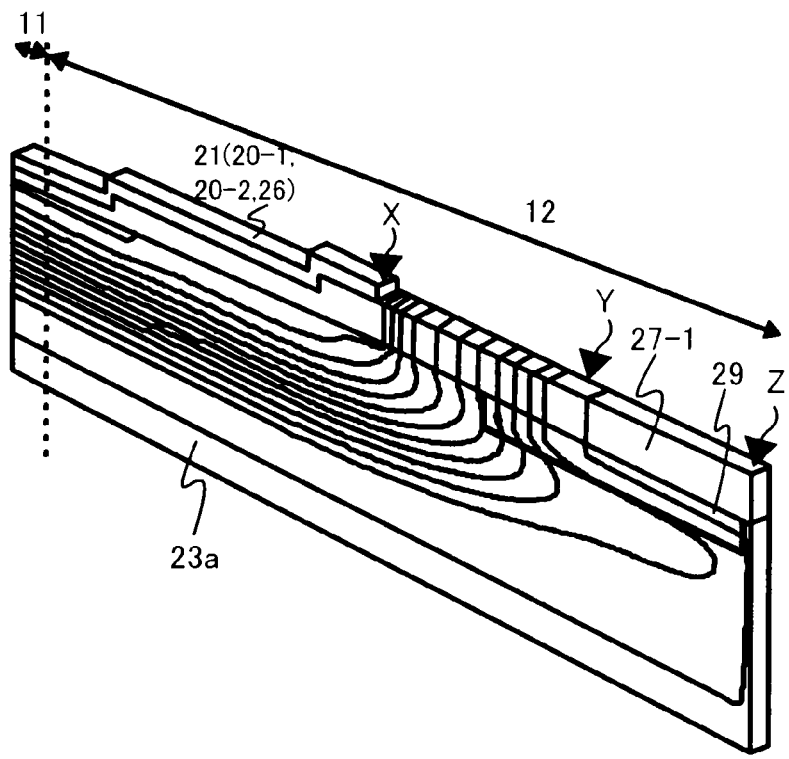
FIG. 20 is a graph showing the result of simulating the potential distribution in the device cross section illustrated in FIG. 8.
Figure 21:
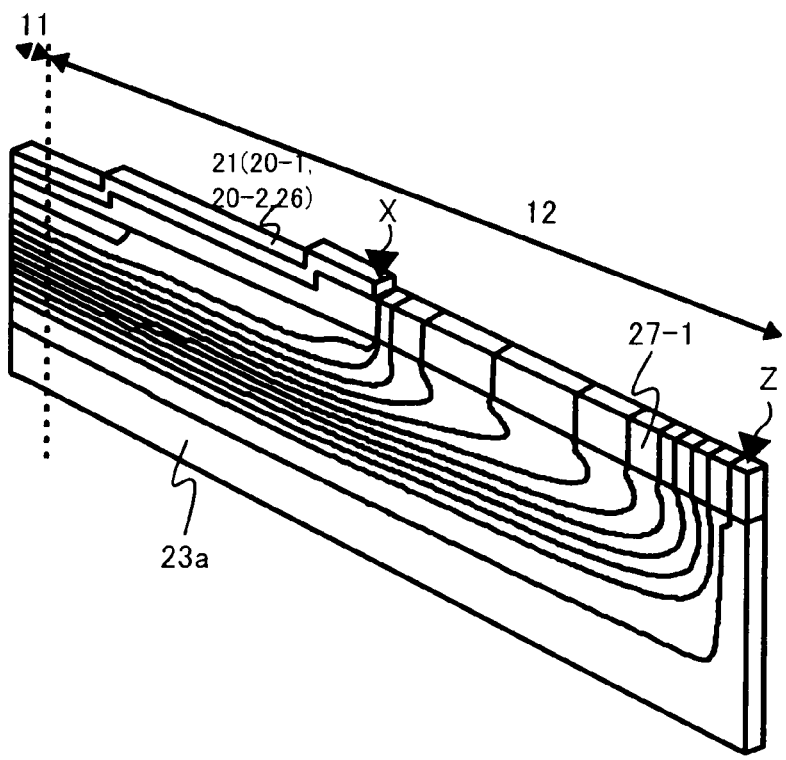
FIG. 21 is a graph showing the result of simulating the potential distribution in the device cross section illustrated in FIG. 9.

FIG. 20 is a graph showing the simulation result indicating the potential distribution in the cross section illustrated in FIG. 8 under the balanced condition. FIG. 21 is a graph showing the simulation result indicating the potential distribution in the cross section illustrated in FIG. 9 under the balanced condition. It is found that the distribution of the isoelectric lines shown in FIG. 20 is sparser on the outer peripheral surface of the SJ structure region 23 than that in the distribution of the isoelectric lines shown in FIG. 21. This agrees with the results shown in FIG. 12.

Figure 22:
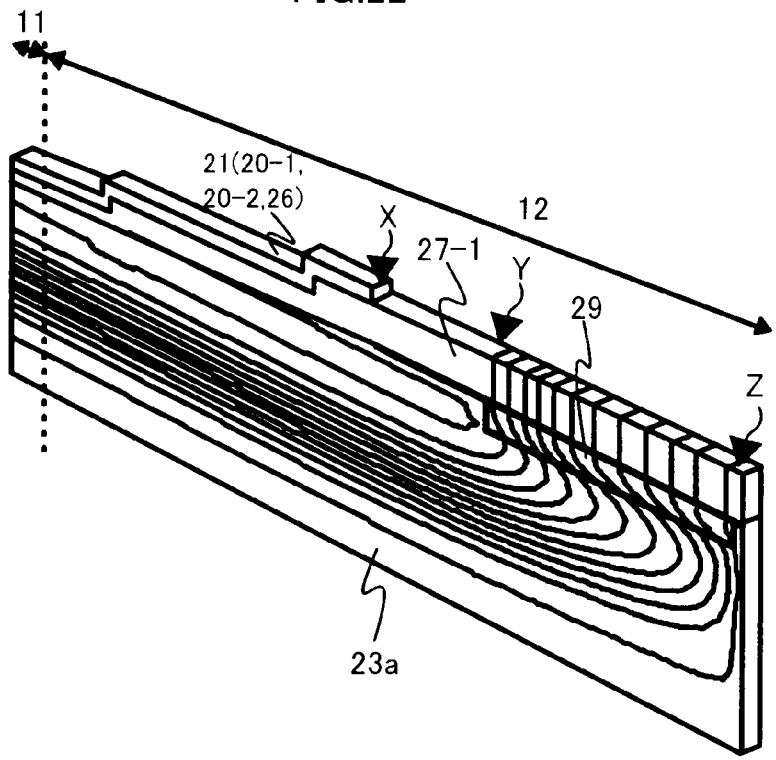
FIG. 22 is a graph showing the result of simulating the potential distribution in the device cross section illustrated in FIG. 8, with the device condition changed.
Figure 23:
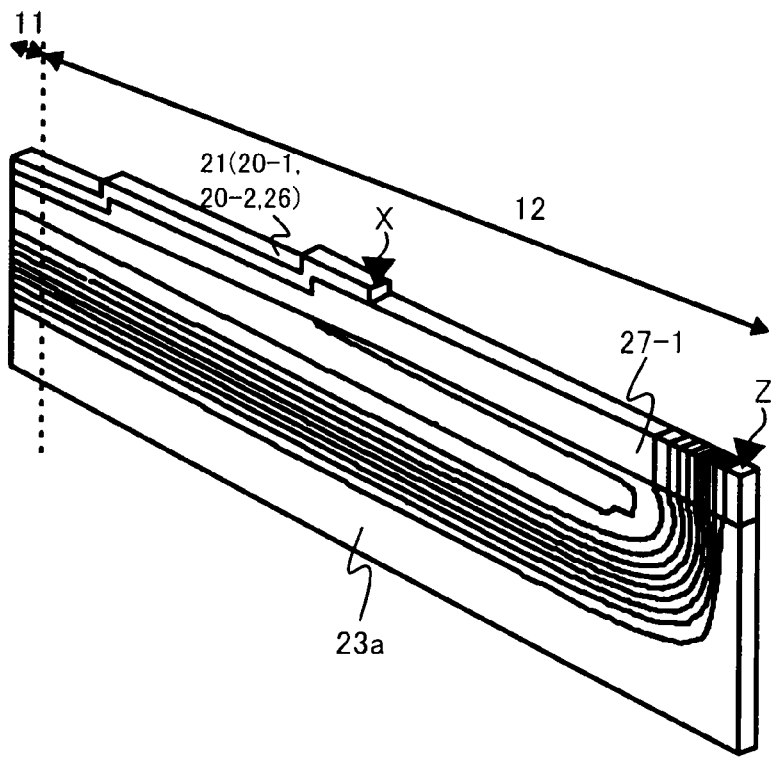
FIG. 23 is a graph showing the result of simulating the potential distribution in the device cross section illustrated in FIG. 9, with the device condition changed.

FIG. 22 is a graph showing the simulation result indicating the potential distribution in the cross section illustrated in FIG. 8 under the p-rich condition. FIG. 23 is a graph showing the simulation result indicating the potential distribution in the cross section illustrated in FIG. 9 under the p-rich condition. It is found that the distribution of the isoelectric lines shown in FIG. 22 is much sparser on the outer peripheral surface of the SJ structure region 23 than that in the distribution of the isoelectric lines shown in FIG. 23. This agrees with the results shown in FIG. 13.

As illustrated in FIGS. 16 to 23, the respective simulation results of the electric field distribution illustrated in FIGS. 10 to 13 are consistent with the respective simulation results of the potential distribution.

As described above, according to the vertical power semiconductor device of the embodiment, the n-type impurity layer 29 is formed on the outer peripheral surface of the SJ structure region 23. Accordingly, even when the balance between the respective impurity concentrations in the device p-pillar layer 23-1a and the device n– pillar layer 23-1b, and the terminal p– pillar layer 23-2a and the terminal n– pillar layer 23-2b are shifted toward the p-rich side, it is possible to reduce the electric field on the outer peripheral surface in the SJ structure region 23. Especially under the p-rich condition, the effect of decreasing the electric field is remarkable. Accordingly, it is possible to improve a withstand voltage and reliability of the device.

The power semiconductor device according to the embodiment of the invention has been described above. The invention, however, is not limited to the above-described embodiment.

Figure 24:
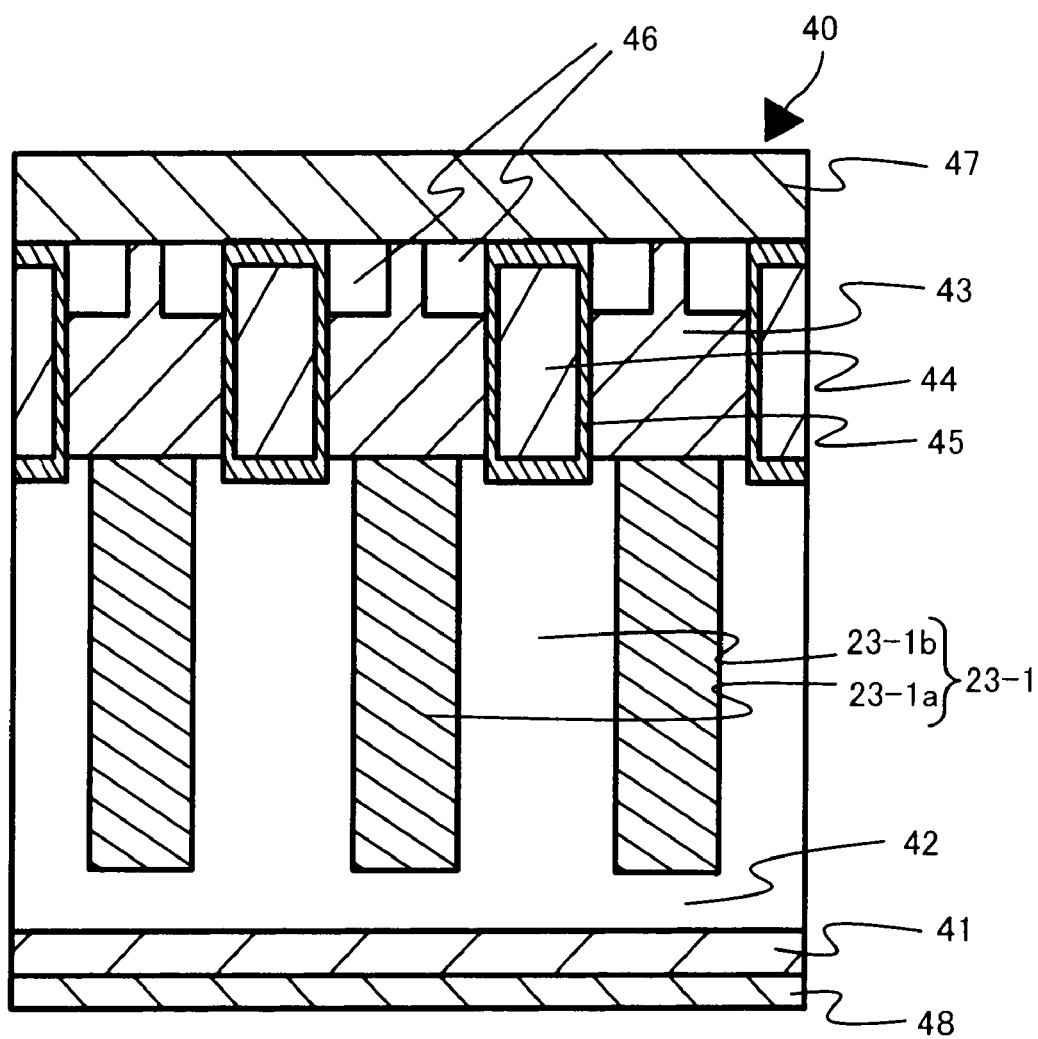
FIG. 24 is a partial cross-sectional view illustrating the structure of a device section of a power semiconductor device according to a modified example of the invention.

As a form of the vertical power semiconductor device formed in the device section 11, according to the invention, for example, a trench gate vertical MOSFET produces the same effects as those described above, in addition to the planar gate type. FIG. 24 illustrates a cross-sectional view of the trench gate vertical MOSFET. As illustrated in FIG. 24, the trench gate MOSFET 40 has an n-type region 42 formed through the epitaxial growth on a surface of a high concentrated n+ semiconductor substrate 41. P-base layers 43 are formed on the n-type region 42. Trench gates 44 are formed in the p-base layers 43, penetrating it to reach the n-type region 42. These trench gates 44 are of embedded Poly-Si$_4$ serving as a gate electrode with insulating layers 45 therearound. The insulating layers 45 are a gate insulating layer and an interlayer insulation layer. The gate insulating layer is formed between the gate electrode and the first base region, and between the gate electrode and the first conductive type region. The interlayer insulation layer is formed on the gate electrode. N+ source layers 46 are formed on the surface of the p-base layers 43 in a region in contact with the gate insulating layer 45 formed on the trench gates 44. A source electrode 47 is formed on the surface of the p-base layer 43 with the trench gates 44 and the n+ source layers 46 formed therein, and a drain electrode 48 is formed on the rear surface of the n+ semiconductor substrate 41. A super junction structure region 23 is formed in the n-type region 42 of this trench gate MOSFET 40.

While the above-described planar gate MOSFET 14 or trench gate MOSFET 40 is an n-channel MOSFET, it may alternatively be a so-called p-channel MOSFET in which all the conductivity types other than that of the n-type impurity layer 29 are inverted.

Further, the vertical power semiconductor device may comprise other transistors such as an IGBT (Integrated Gate Bipolar Transistor). In the case of IGBT, the source electrode 21 and the drain electrode 22 are respectively replaced with an emitter electrode and a collector electrode. Further, as a transistor component, a p-collector layer is provided between the rear surface of the n+ semiconductor substrate 13 and the drain electrode 22.

Figure 25:
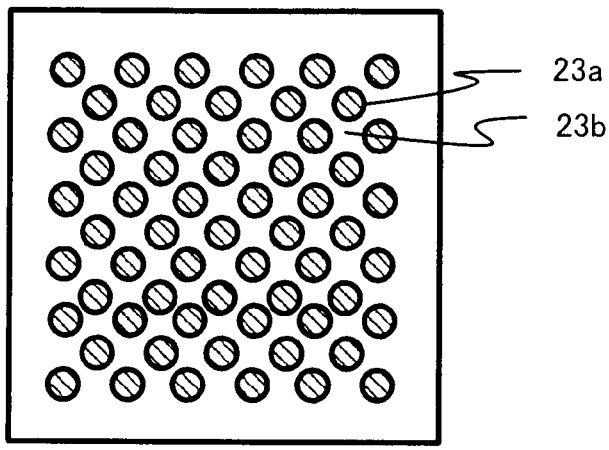
FIG. 25 is a horizontal cross-sectional view illustrating a modified example of the super junction structure.
Figure 26:
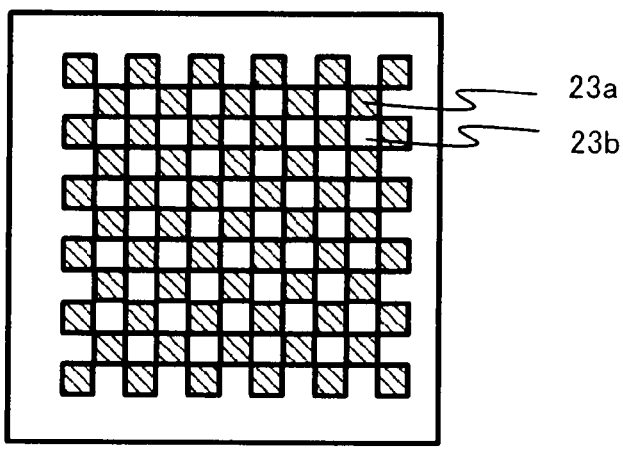
FIG. 26 is a horizontal cross-sectional view illustrating a modified example of the super junction structure.
Figure 27:
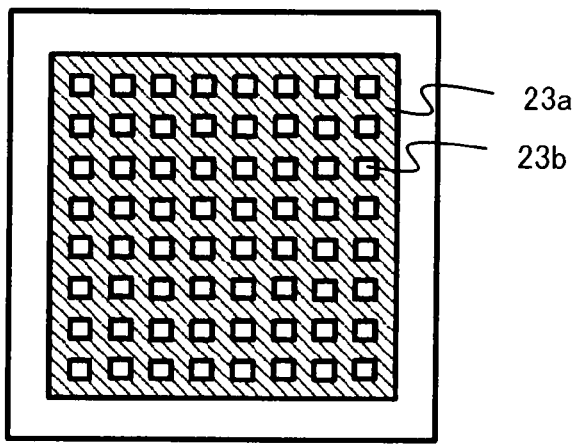
FIG. 27 is a horizontal cross-sectional view illustrating a modified example of the super junction structure.
Figure 28:
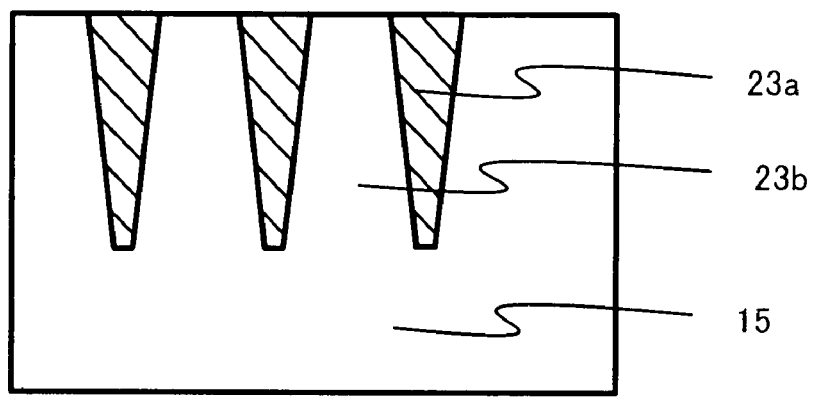
FIG. 28 is a vertical cross-sectional view illustrating a modified example of p− pillar layers forming the super junction structure.
Figure 29:
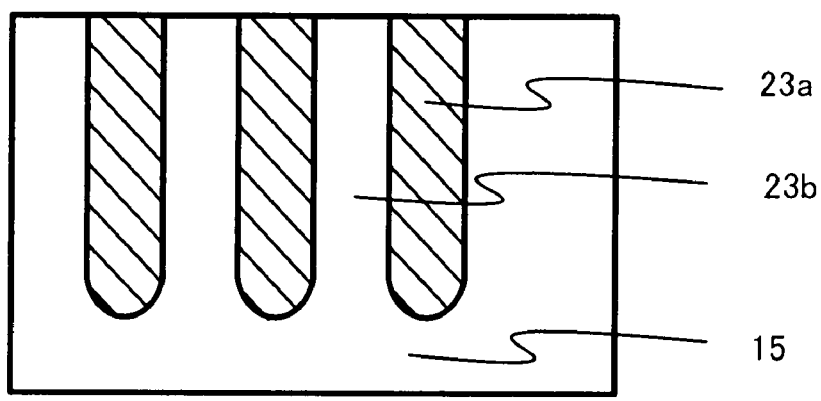
FIG. 29 is a vertical cross-sectional view illustrating a modified example of the p− pillar layers forming the super junction structure.
Figure 30:
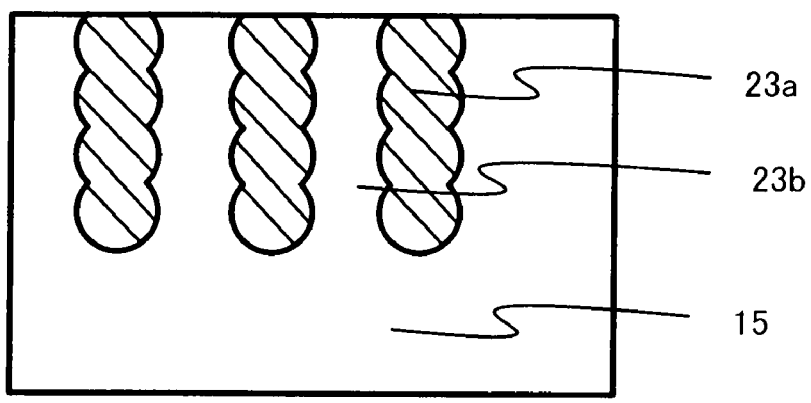
FIG. 30 is a vertical cross-sectional view illustrating a modified example of the p− pillar layers forming the super junction structure.

A stripe shaped SJ structure region 23 is formed in the n-type impurity region 15 in the embodiment, as illustrated in FIG. 5. The horizontal cross sectional shape of the p- pillar layer 23a including the device p- pillar layer 23-1a and the terminal p- pillar layer 23-2, however, may be formed, for example, into a polka dot shape, a houndstooth check shape, or a mesh shape as illustrated in FIGS. 25 to 27. Further, while the vertical cross sectional shape of the p- pillar layer 23a in the embodiment is, for example, a rectangle as illustrated in FIG. 2, it may be a tapered shape, for example, as illustrated in FIG. 28, or a shape having a curved end to the depth direction as illustrated in FIG. 29. Alternatively, it may be a bunched shape as illustrated in FIG. 30. Especially when forming the p- pillar layer 23a through the repetition of the epitaxial growth and the impurity implantation as described above, it becomes the bunched shape as illustrated in FIG. 30.

While the terminal section 12 has the gate field plate electrode 26 in the vertical power semiconductor device of the embodiment, the terminal section 12 may have a Resurf layer or a guard ring layer.

What is claimed is:

1. A vertical type power semiconductor device having a super junction structure, a first conductive type high concentration semiconductor substrate and a first conductive type region formed on the high concentration semiconductor substrate, and comprising a device section and a terminal section that is an outer peripheral portion of the device section, wherein
    the device section includes:
    a second conductive type first base region formed on a surface area of the first conductive type region,
    a first conductive type source region formed on a surface area of the first base region,
    a gate electrode formed on at least a partial region of the first base region with an insulating layer,
    a source electrode formed on the source region in contact with the first base region,
    a second conductive type device pillar layer extending from the first base region in a depth direction of the first conductive type region, and
    a drain electrode formed on a rear surface of the first conductive type high concentration semiconductor substrate, and
    the terminal section includes:
    a plurality of second conductive type terminal pillar layers extending from the surface of the first conductive type region in the depth direction of the first conductive type region, and
    a first conductive type impurity layer formed in a ring shape on a surface area of the terminal pillar layers including the outermost periphery of the plurality of terminal pillar layers.

2. The vertical type power semiconductor device having a super junction structure according to claim 1, wherein
    the second conductive type device pillar layer and the second conductive type terminal pillar layers are arranged in one of a stripe shape, a polka dot shape, a houndstooth check shape, and a mesh shape from a viewpoint of a horizontal cross section.

3. The vertical type power semiconductor device having a super junction structure according to claim 1, wherein
    each shape of the second conductive type device pillar layer and the second conductive type terminal pillar layers is one of a rectangle shape, a tapered shape, and a bunched shape from a viewpoint of a vertical cross section.

4. The vertical type power semiconductor device having a super junction structure according to claim 1, wherein
    a second conductive type contact region having higher concentration than the first base region is formed on a surface the first base region and the source region is formed on an interface between the first base region and the contact region.

5. The vertical type power semiconductor device having a super junction structure according to claim 1, wherein
    the terminal section includes:
    a second conductive type second base region formed on the surface of the first conductive type region with a part thereof protruding to the first conductive type region of the device section,
    a ring shaped gate electrode formed on a part of the second base region and the first conductive type region of the terminal section with an insulating film, the ring shaped gate electrode surrounding a plurality of gate electrodes, and
    the source electrode extending to a position in contact with the second base region, and
    one end of a part of the plurality of the second conductive type terminal pillar layers is formed in contact with the second base region.

6. The vertical type power semiconductor device having a super junction structure according to claim 1, wherein
    the terminal section includes:
    a second conductive type third base region formed on the outer peripheral surface of the first conductive type region,
    a high concentration first conductive type layer formed on the surface of the third base region near an interface between the third base region and the first conductive type region, and
    an EQPR electrode formed on the first conductive type region inside the third base region with an insulating film between the EQPR electrode and the first conductive type region.

7. The power semiconductor device according to claim 1, wherein the first conductivity type impurity layer is formed on a surface area of an outermost terminal pillar located in the terminal section.

8. The vertical type power semiconductor device having a super junction structure according to claim 3, wherein
    another end of each of the second conductive type device pillar layer and the second conductive type terminal pillar layers is formed into a curved shape from a viewpoint of a vertical cross section.

9. The vertical type power semiconductor device having a super junction structure according to claim 5, wherein
    a gate field plate electrode is formed on the ring shaped gate electrode.

10. The vertical type power semiconductor device having a super junction structure according to claim 5, wherein
    a second conductive type contact region having higher concentration than the second base region is formed on the second base region.

11. The vertical type power semiconductor device having a super junction structure according to claim 6, wherein
the terminal section further includes an EQPR taking out electrode and the EQPR electrode connects with the high concentration first conductive type layer by the EQPR taking out electrode electrically.

12. A vertical type power semiconductor device having a super junction structure, a first conductive type high concentration semiconductor substrate and a first conductive type region formed on the high concentration semiconductor substrate, and comprising a device section and a terminal section that is an outer peripheral portion of the device section, wherein
the device section includes:
a second conductive type first base region formed on a surface area of the first conductive type region,
a gate electrode formed in the first base region, penetrating the first base region to reach the first conductive type region,
a first insulating layer with a second portion formed on the gate electrode formed between the gate electrode and the first base region, between the gate electrode and the first conductive type region,
a second insulating layer formed on the gate electrode,
a source electrode formed on the second insulating layer, the first base region, and the source region,
a second conductive type device pillar layer extending from the first base region in a depth direction of the first conductive type region, and
a drain electrode formed on a rear surface of the first conductive type high concentration semiconductor substrate, and
the terminal section includes:
a plurality of second conductive type terminal pillar layers extending from the surface of the first conductive type region in the depth direction of the first conductive type region, and
a first conductive type impurity layer formed in a ring shape on a surface area of the terminal pillar layers including the outermost periphery of the plurality of terminal pillar layers.

13. The vertical type power semiconductor device having a super junction structure according to claim 12, wherein
the second conductive type device pillar layer and the second conductive type terminal pillar layers are arranged in one of a stripe shape, a polka dot shape, a houndstooth check shape, and a mesh shape from a viewpoint of a horizontal cross section.

14. The vertical type power semiconductor device having a super junction structure according to claim 12, wherein
each shape of the second conductive type device pillar layer and the second conductive type terminal pillar layers is one of a rectangle shape, a tapered shape, and a bunched shape from a viewpoint of a vertical cross section.

15. The vertical type power semiconductor device having a super junction structure according to claim 14, wherein
another end of each of the second conductive type device pillar layer and the second conductive type terminal pillar layers is formed into a curved shape from a viewpoint of a vertical cross section.

16. The vertical type power semiconductor device having a super junction structure according to claim 12, wherein
the terminal section includes:
a second conductive type second base region formed on the surface of the first conductive type region with a part thereof protruding to the first conductive type region of the device section,
a ring shaped gate electrode formed on a part of the second base region and the first conductive type region of the terminal section with an insulating film, the ring shaped gate electrode surrounding a plurality of gate electrodes, and
the source electrode extending to a position in contact with the second base region, and
one end of a part of the plurality of the second conductive type terminal pillar layers is formed in contact with the second base region.

17. The vertical type power semiconductor device having a super junction structure according to claim 12, wherein
the terminal section includes:
a second conductive type third base region formed on the outer peripheral surface of the first conductive type region,
a high concentration first conductive type layer formed on the surface of the third base region near an interface between the third base region and the first conductive type region, and
an EQPR electrode formed on the first conductive type region inside the third base region with an insulating film between the EQPR electrode and the first conductive type region.

18. The power semiconductor device according to claim 12, wherein the first conductivity type impurity layer is formed on a surface area of an outermost terminal pillar located in the terminal.

19. The vertical type power semiconductor device having a super junction structure according to claim 16, wherein
a gate field plate electrode is formed on the ring shaped gate electrode.

20. The vertical type power semiconductor device having a super junction structure according to claim 17, wherein
the terminal section further includes an EQPR taking out electrode and the EQPR electrode connects with the high concentration first conductive type layer by the EQPR taking out electrode electrically.

* * * * *